US007795597B2

(12) United States Patent
Nagae et al.

(10) Patent No.: US 7,795,597 B2
(45) Date of Patent: Sep. 14, 2010

(54) DEFLECTOR ARRAY, EXPOSURE APPARATUS, AND DEVICE MANUFACTURING METHOD

(75) Inventors: Kenichi Nagae, Kawasaki (JP); Masatoshi Kanamaru, Inashiki-gun (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 236 days.

(21) Appl. No.: 11/779,498

(22) Filed: Jul. 18, 2007

(65) Prior Publication Data
US 2008/0017807 A1    Jan. 24, 2008

(30) Foreign Application Priority Data
Jul. 20, 2006    (JP)    ............... 2006-197747

(51) Int. Cl.
*G21K 1/087*    (2006.01)
(52) U.S. Cl. ............... 250/396 R; 250/398; 250/491.1; 250/492.1; 250/492.2; 250/492.3
(58) Field of Classification Search ............. 250/396 R, 250/398, 306, 307, 309, 310, 311, 442.11, 250/491.1, 492.1, 492.2, 492.21, 492.3
See application file for complete search history.

(56) References Cited

U.S. PATENT DOCUMENTS

| 4,982,099 | A | * | 1/1991 | Lischke | ............. | 250/492.2 |
| 5,214,289 | A | * | 5/1993 | Betsui | ............. | 250/396 R |
| 5,260,579 | A | * | 11/1993 | Yasuda et al. | ............. | 250/492.2 |
| 5,262,341 | A | * | 11/1993 | Fueki et al. | ............. | 438/618 |
| 5,376,802 | A | * | 12/1994 | Sakamoto et al. | ...... | 250/492.23 |
| 5,528,048 | A |   | 6/1996 | Oae et al. |   |   |
| 5,614,725 | A |   | 3/1997 | Oae et al. |   |   |
| 5,841,145 | A | * | 11/1998 | Satoh et al. | ............. | 250/492.22 |
| 5,920,077 | A |   | 7/1999 | Oae et al. |   |   |
| 5,977,548 | A |   | 11/1999 | Oae et al. |   |   |
| 6,014,200 | A | * | 1/2000 | Sogard et al. | ............. | 355/53 |
| 6,118,129 | A |   | 9/2000 | Oae et al. |   |   |
| 6,472,674 | B1 | * | 10/2002 | Muraki | ............. | 250/492.22 |
| 6,486,479 | B1 | * | 11/2002 | Oae et al. | ............. | 250/492.2 |
| 6,646,275 | B2 |   | 11/2003 | Oae et al. |   |   |
| 6,835,937 | B1 | * | 12/2004 | Muraki et al. | ............. | 250/396 R |
| 6,872,951 | B2 | * | 3/2005 | Yagi et al. | ............. | 250/396 R |
| 7,060,984 | B2 |   | 6/2006 | Nagae et al. | ............. | 250/396 R |
| 7,109,494 | B2 |   | 9/2006 | Ono et al. | ............. | 250/396 R |
| 2003/0183778 | A1 | * | 10/2003 | Haraguchi | ............. | 250/492.2 |
| 2003/0209673 | A1 | * | 11/2003 | Ono et al. | ............. | 250/396 R |

(Continued)

FOREIGN PATENT DOCUMENTS

JP    7-297107    11/1995

*Primary Examiner*—Bernard E Souw
*Assistant Examiner*—Michael J Logie
(74) *Attorney, Agent, or Firm*—Fitzpatrick, Cella, Harper & Scinto (57) ABSTRACT

A deflector array in which a plurality of deflectors, which deflect charged particle beams, are arrayed on a substrate. The plurality of deflectors include respective openings different from each other formed on the substrate. Each of the plurality of deflectors includes a pair of electrodes opposing each other through a corresponding opening, and the plurality of deflectors are arrayed such that a length of the pair of electrodes in a longitudinal direction thereof is not less than a distance between centers of two of the plurality of deflectors which are located nearest to each other.

9 Claims, 12 Drawing Sheets

U.S. PATENT DOCUMENTS

2004/0169147 A1* 9/2004 Ono et al. .............. 250/396 R
2005/0087701 A1* 4/2005 Lammer-Pachlinger et al. .. 250/492.22
2005/0201246 A1* 9/2005 Buschbeck et al. .......... 369/101
2005/0242302 A1* 11/2005 Platzgummer et al. . 250/492.22

* cited by examiner

DEFLECTOR ARRAY, EXPOSURE APPARATUS, AND DEVICE MANUFACTURING METHOD

This application claims the benefit of Japanese Patent Application No. 2006-197747, filed Jul. 20, 2006, which is hereby incorporated by reference herein in its entirety.

BACKGROUND OF THE INVENTION

1. Field of the Invention

The present invention relates to, e.g., a deflector array suitable as a component of a charged particle beam exposure apparatus, such as an electron beam exposure apparatus and an ion beam exposure apparatus, used to manufacture a device, such as a semiconductor integrated device, an exposure apparatus having the deflector array, and a device manufacturing method using the exposure apparatus.

2. Description of the Related Art

Figure 10:
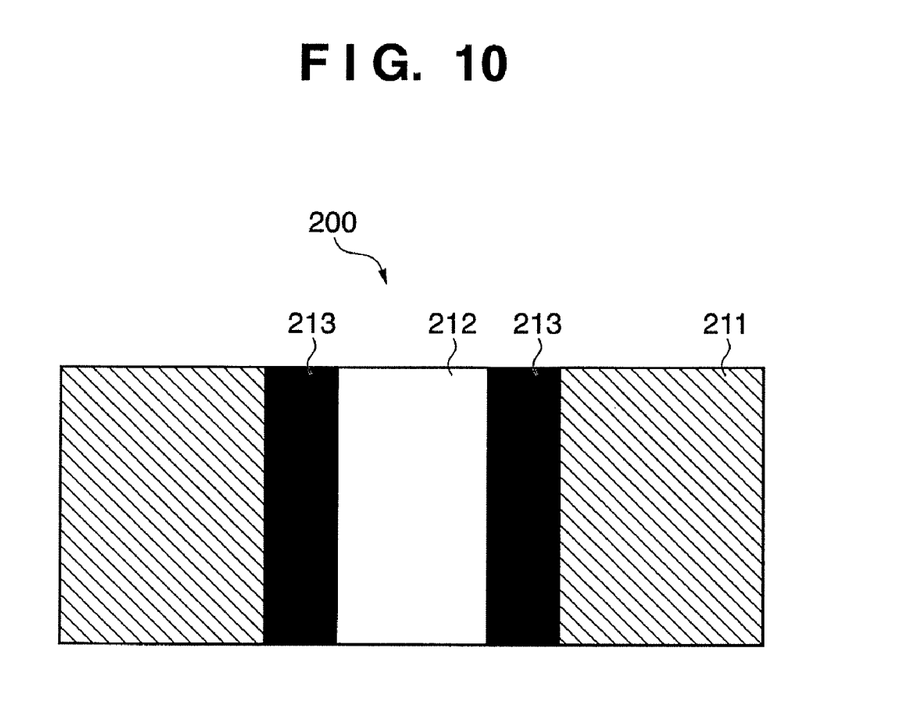
FIG. 10 is sectional view showing a deflector of a deflector array according to the prior art.

Conventionally, as shown in FIG. 10, a deflector 200 is used as a component of a charged particle beam exposure apparatus, such as an electron beam exposure apparatus and an ion beam exposure apparatus, used to manufacture a device, such as a semiconductor integrated device. As shown in FIG. 10, the deflector 200 has a substrate 211, an opening 212 formed to pass a charged particle beam to the substrate 211, and a pair of electrodes 213 opposing each other through the opening 212.

Figure 11:
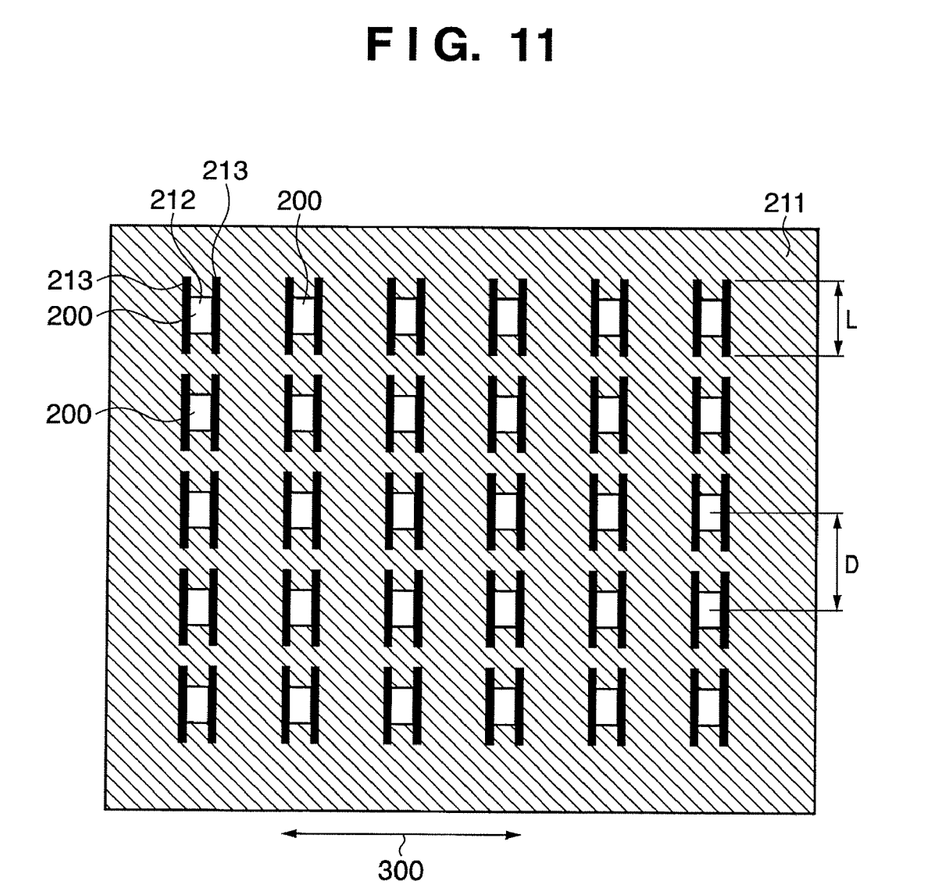
FIG. 11 is a plan view showing the deflector array according to the prior art.

As shown in FIG. 11, the deflectors 200 are arrayed such that a direction 221 of a line connecting the centers of two deflectors 200 located nearest to each other become perpendicular to a direction 300 in which a pair of opposing electrodes 213 deflect a charged particle beam.

For this reason, a length L of the electrode 213 of the deflector 200 cannot be longer than a distance D between the centers of two deflectors located nearest to each other in the direction 221.

The deflector 200 of the deflector array used for a charged particle beam exposure apparatus for drawing a pattern with a plurality of charged particle beams must be arranged at the pitch of the charged particle beams, e.g., a pitch of several tens to several hundreds of microns. This makes it impossible to sufficiently ensure the length of the electrode 213 of the deflector 200 to result in an increase in deflection aberration.

When, however, the charged particle beam exposure apparatus uses a charged particle beam deflected by the deflector 200 of the deflector array, deflection aberration must be decreased to attain high drawing accuracy. To decrease the deflection aberration of the deflector 200 of the deflector array, it is effective to maximize the length of the opposing electrodes 213.

Japanese Patent Laid-Open No. 7-297107 discloses deflectors arrayed to make uniform the signal delay amount.

SUMMARY OF THE INVENTION

It is an object of the present invention to provide a deflector array having an arrangement advantageous to decrease deflection aberration, and an application example of the deflector array.

A first aspect of the present invention relates to a deflector array in which a plurality of deflectors, which deflect charged particle beams, are arrayed on a substrate. In the array, each deflector includes an opening formed on the substrate, and a pair of electrodes opposing each other through the opening. The length of the pair of electrodes in the longitudinal direction is not less than the distance between the centers of two deflectors, which are located nearest to each other.

According to a preferred embodiment of the present invention, the direction of a line connecting the centers of two deflectors, which are located nearest to each other, form an angle of 45° with respect to the direction in which the deflector deflects the charged particle beam. Alternatively, according to another preferred embodiment of the present invention, the direction of a line connecting the centers of two deflectors, which are located nearest to each other, form an angle of 63.4° with respect to the direction in which the deflector deflects the charged particle beam.

According to a preferred embodiment of the present invention, the direction in which the deflector deflects the charged particle beam is perpendicular to the longitudinal direction of the pair of electrodes.

According to a preferred embodiment of the present invention, the pair of electrodes are parallel to each other. Alternatively, according to another preferred embodiment of the present invention, the distance between the pair of electrodes shortens toward the end portions of the pair of electrodes.

A second aspect of the present invention relates to an exposure apparatus which exposes a wafer with a charged particle beam. The exposure apparatus includes a charged particle source, which emits the charged particle beam, a first electron optical system which forms a plurality of intermediate images of the charged particle source, a second electron optical system which projects the plurality of intermediate images formed by the first electron optical system onto the wafer, and a positioning apparatus which holds, drives, and positions the wafer. The first electron optical system includes the above-described deflector array.

A third aspect of the present invention relates to a device manufacturing method. The manufacturing method includes the steps of exposing a wafer using the above-described exposure apparatus, and developing the wafer.

According to the present invention, a deflector array having an arrangement advantageous to decrease deflection aberration, and an application example of the deflector array are provided.

Further features of the present invention will become apparent from the following description of exemplary embodiments, with reference to the attached drawings.

DESCRIPTION OF THE EMBODIMENTS

Embodiments of the present invention will be described below with reference to the accompanying drawings.

First Embodiment

Figure 1:
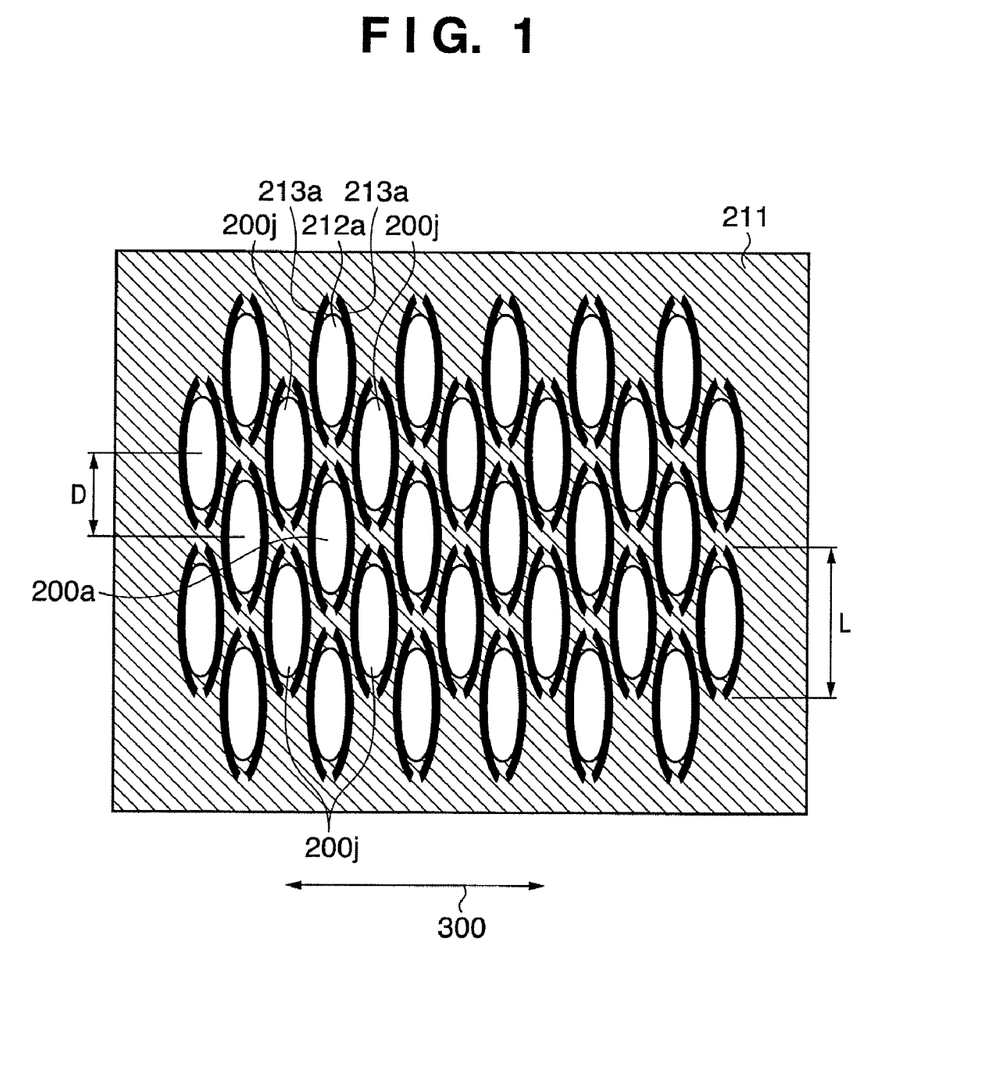
FIG. 1 is a plan view showing a deflector array according to the first embodiment of the present invention.

A deflector array according to the first embodiment of the present invention will be explained with reference to the plan view shown in FIG. 1. The deflector array is formed by arraying a plurality of deflectors 200a and 200j for deflecting charged particle beams on a substrate 211. Each deflector has an opening 212a formed on the substrate 211, and a pair of electrodes 213a opposing each other through the opening 212a.

A length L of the pair of electrodes 213a in the longitudinal direction is not less than a distance D between the centers of the two deflectors 200a and 200j located nearest to each other. In the deflector array according to the first embodiment, therefore, the length L of the pair of electrodes 213a in the longitudinal direction can be relatively long. This makes it possible to decrease the deflection aberration of charged particle beams deflected by the deflectors 200a and 200j.

In the first embodiment, a direction 300 in which a deflector deflects a charged particle beam is perpendicular to the longitudinal direction of the electrode 213a.

Also, in the first embodiment, the distance between each pair of electrodes 213a shortens toward their end portions.

Applying the deflector array according to the first embodiment to an electron beam exposure apparatus makes it possible to attain high drawing accuracy.

Second Embodiment

Figure 2:
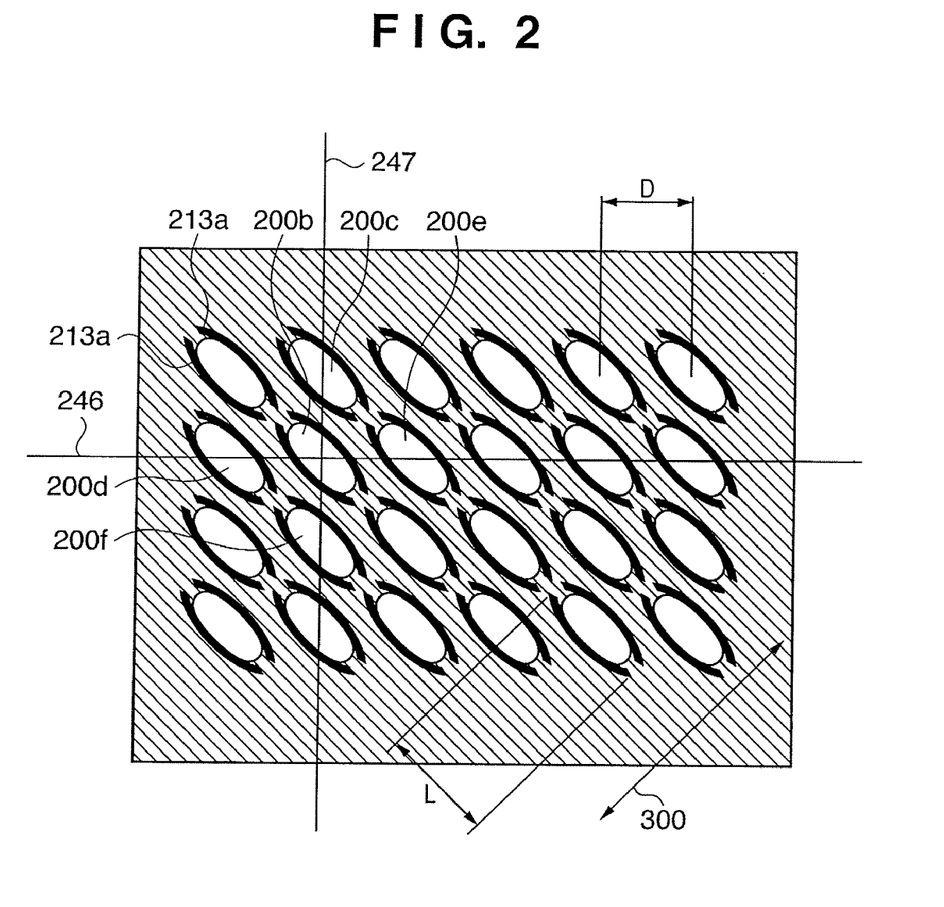
FIG. 2 is a plan view showing a deflector array according to the second embodiment of the present invention.

A deflector array according to the second embodiment of the present invention will be explained with reference to the plan view shown in FIG. 2. Directions 246 and 247 form an angle of about 45° with respect to a direction 300 in which a deflector deflects a charged particle beam. The directions 246 and 247 are of lines connecting the center of a deflector 200b to the centers of deflectors 200d and 200e and to the centers of deflectors 200c and 200f, respectively, all of which are located nearest to the deflector 200b.

In the deflector array according to the second embodiment, a length L of electrodes 213a of the deflectors 200b, 200c, 200d, 200e, and 200f can be about $\sqrt{2}$ times as long as a distance D between the center of the deflector 200b and the centers of the deflectors 200c, 200d, 200e, and 200f, all of which are located nearest to the deflector 200b.

According to the second embodiment, it is possible to obtain a deflector array, which minimizes deflection aberration. In addition, applying the deflector array according to the second embodiment to an electron beam exposure apparatus makes it possible to attain high drawing accuracy.

Third Embodiment

Figure 3:
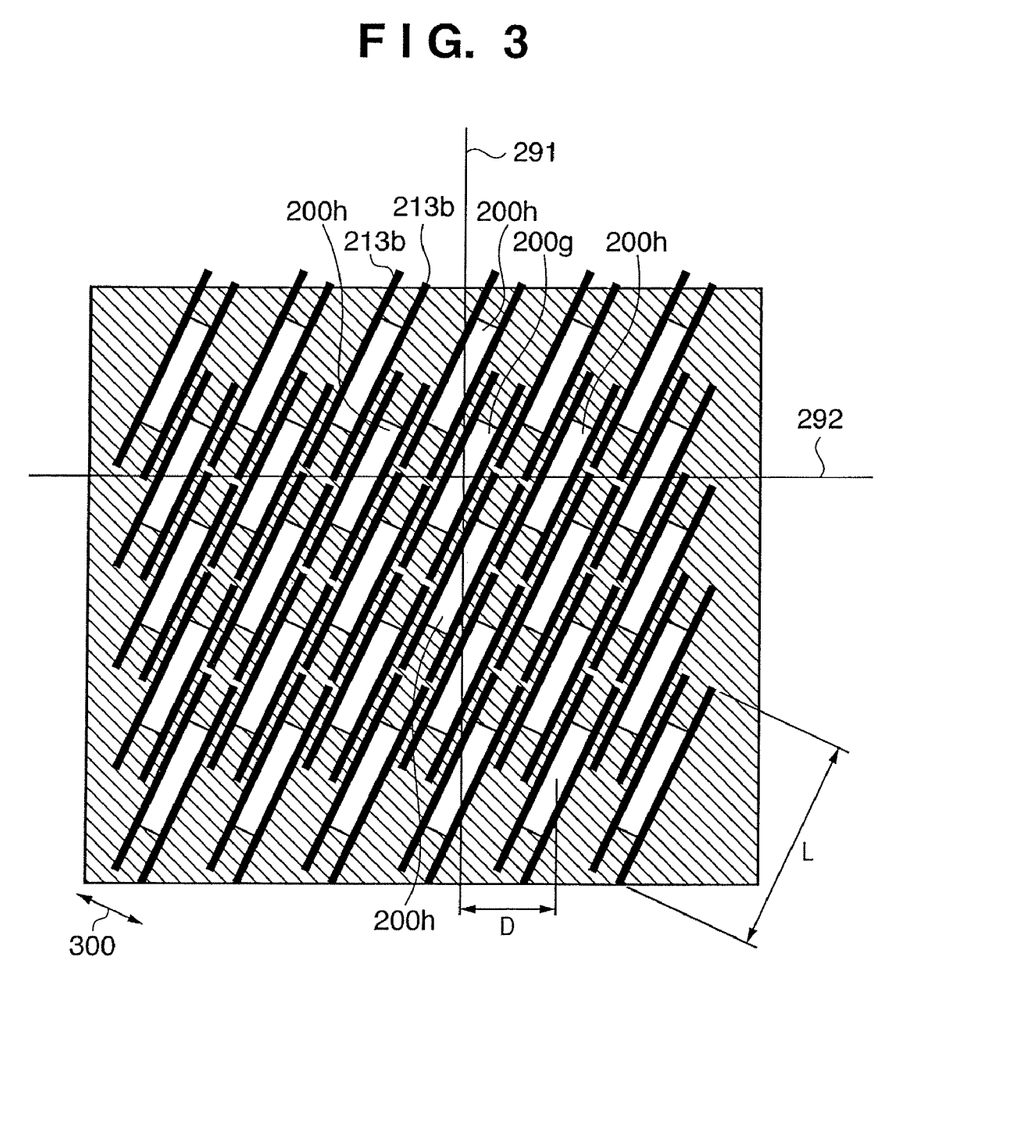
FIG. 3 is a plan view showing a deflector array according to the third embodiment of the present invention.

A deflector array according to the third embodiment of the present invention will be explained with reference to the plan view shown in FIG. 3. One of directions 291 and 292 forms an angle of about 63.4° with respect to a direction 300 in which a deflector deflects a charged particle beam. The directions 291 and 292 are of lines connecting the center of deflector 200g to the centers of deflectors 200h located nearest to it.

In the deflector array according to the third embodiment, a length L of electrodes 213b of the deflectors 200g and 200h can be about $\sqrt{5}$ times as long as a distance D between the center of the deflector 200g and the centers of the deflectors 200h located nearest to it.

According to the third embodiment, it is possible to obtain a deflector array which minimizes deflection aberration. In addition, applying the deflector array according to the third embodiment to an electron beam exposure apparatus makes it possible to attain high drawing accuracy.

An electron beam exposure apparatus (drawing apparatus) using a deflector array, according to an embodiment of the present invention, will be explained.

The following description will exemplify an exposure apparatus which adopts an electron beam as the charged particle beam. However, the present invention is also applicable to an exposure apparatus using a charged particle beam of another type, such as an ion beam.

Figure 4A:
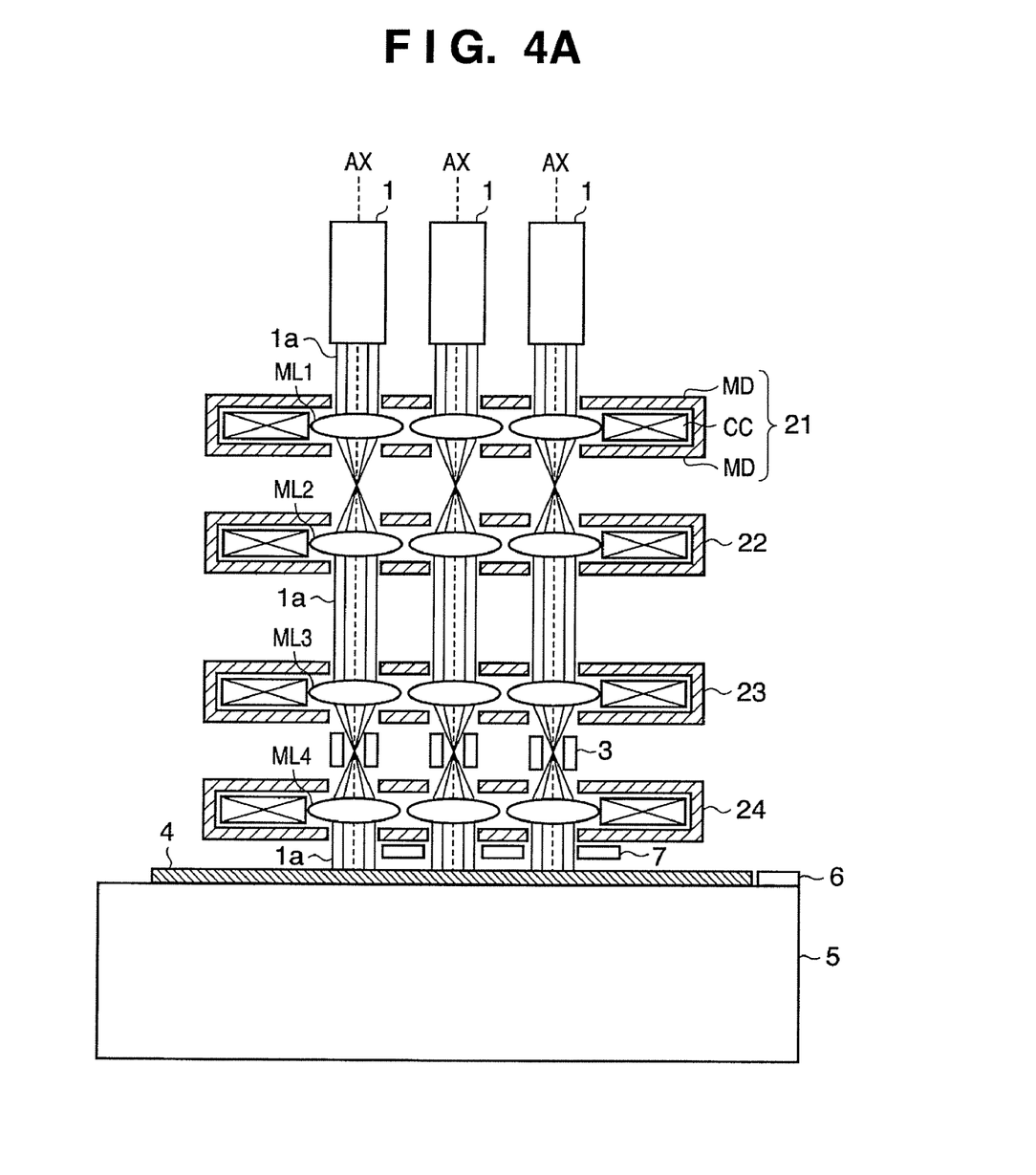
FIGS. 4A and 4B are views schematically showing the main part of an electron beam exposure apparatus according to a preferred embodiment of the present invention.
Figure 4B:
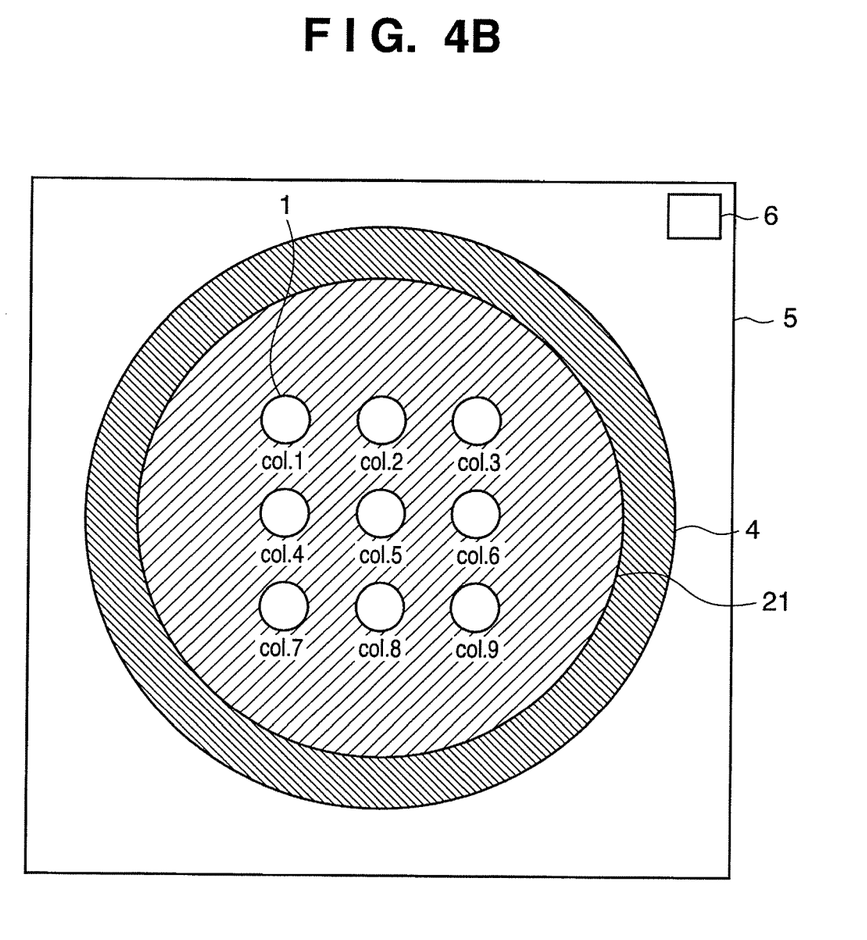

An electron beam exposure apparatus using a deflector array according to the present invention will be explained with reference to the schematic views of the main part shown in FIGS. 4A and 4B.

A multi-source module 1 forms a plurality of electron source images by emitting electron beams from its electron source (charge particle source). In this example, 3×3 multi-source modules 1 are arrayed, and details thereof will be described later.

In this example, each of magnetic field lens arrays 21, 22, 23, and 24 forms an electron optical system and has magnetic disks MD. The magnetic disks MD have 3×3 openings with the same shape, and are vertically arranged with spacings between them. A common coil CC excites the magnetic disks MD. As a consequence, each opening serves as a magnetic pole of a magnetic field lens ML to generate a lens magnetic field as designed.

Four magnetic field lenses ML1, ML2, ML3, and ML4 corresponding to the magnetic field lens arrays 21, 22, 23, and 24 project the plurality of electron source images of each multi-source module 1 onto a wafer 4.

An optical system, which acts on electron beams from one multi-source module 1 until they strike the wafer, is defined as a column. That is, in this example, the exposure apparatus includes nine columns, column 1 to column 9.

The two corresponding magnetic field lenses of the magnetic field lens arrays 21 and 22 once form an image. Then, the two corresponding magnetic field lenses of the magnetic field lens arrays 23 and 24 project the resultant image onto the wafer 4.

The common coils individually control the respective excitation conditions of the magnetic field lens arrays 21, 22, 23, and 24. This makes it possible to adjust the optical characteristics (focal position, image rotation, and magnification) of each column uniformly, i.e., by the same amount.

A main deflector 3 is a positioning apparatus for deflecting a plurality of electron beams from the multi-source module 1 and displacing a plurality of electron source images in the X and Y directions on the wafer 4. A stage 5 is a positioning apparatus which supports the wafer 4 to be movable in the X and Y directions perpendicular to an optical axis AX (Z-axis) and the rotation direction about the Z-axis. A stage reference plate 6 is fixed on the stage 5. A reflected electron detector 7 detects electrons reflected when an electron beam strikes a mark on the stage reference plate 6.

Figure 5:
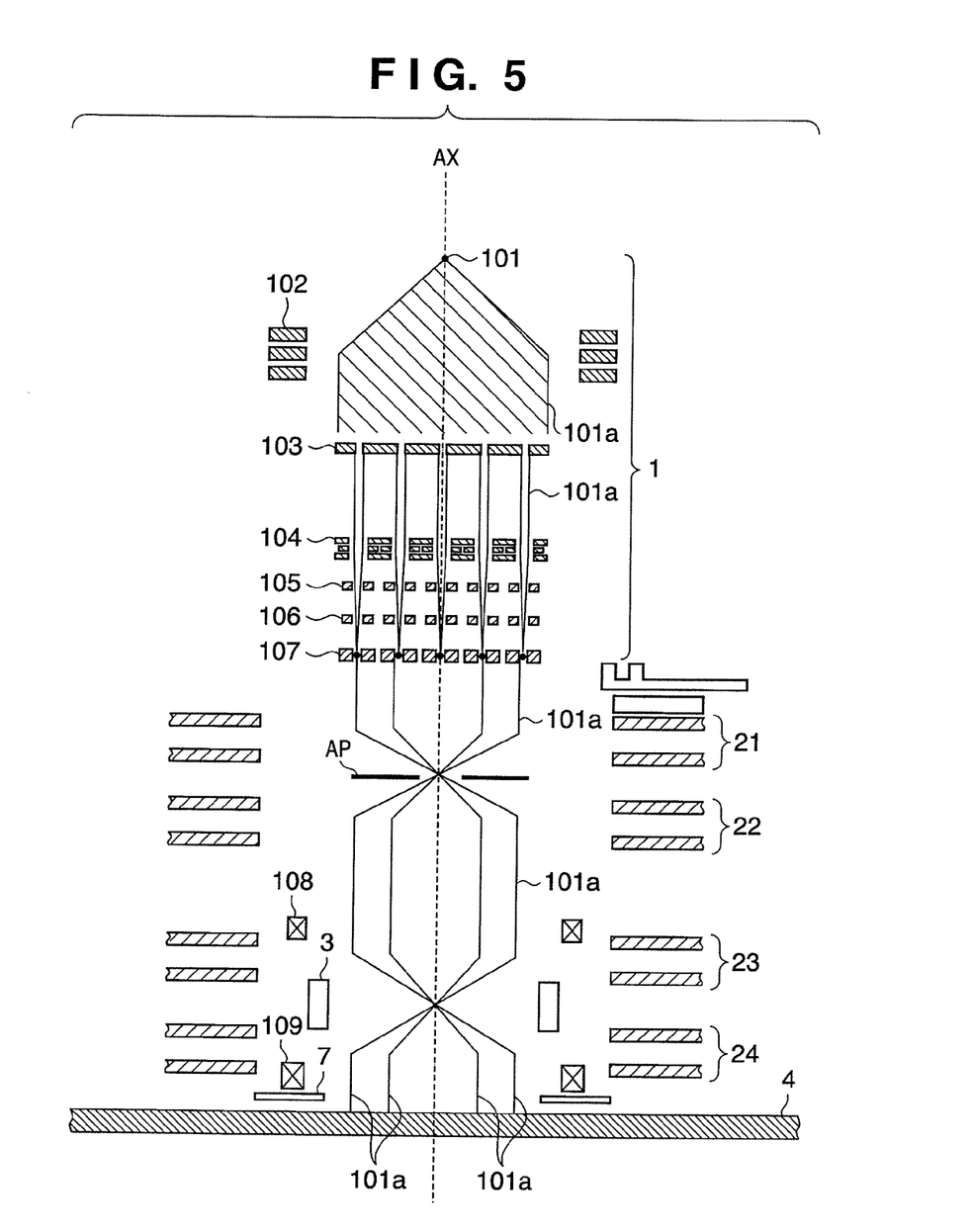
FIG. 5 is a view for explaining electron optical systems for each column of the electron beam exposure apparatus according to the preferred embodiment of the present invention.

FIG. 5 is a view showing details of one column. The multi-source module 1 and its function of adjusting the optical characteristics of an electron beam applied from the multi-source module 1 to the held wafer 4 will be explained.

An electron source 101 (charged particle source) formed by an electron gun emits an electron beam to form a crossover image. A condenser lens 102, which forms an electron optical system, collimates the electron beam emitted by the electron source 101 into a collimated electron beam 101a.

The condenser lens 102 in this example is an electro-static lens including three opening electrodes. An aperture array 103 is an electron optical system having a plurality of two-dimensionally arranged openings. A lens array 104 is an electron optical system having a plurality of two-dimensionally arrayed electro-static lenses. The plurality of electro-static lenses have the same optical power.

Deflector arrays 105 and 106 are electron optical systems, each of which is formed by two-dimensionally arraying electro-static deflectors that can be driven individually.

A blanker array 107 is an electron optical system formed by two-dimensionally arrayed electro-static blankers that can be driven individually.

A deflector array represented by those according to the above-described first to third embodiments is suitable as the deflector arrays 105 and 106 and blanker array 107.

Figure 6:
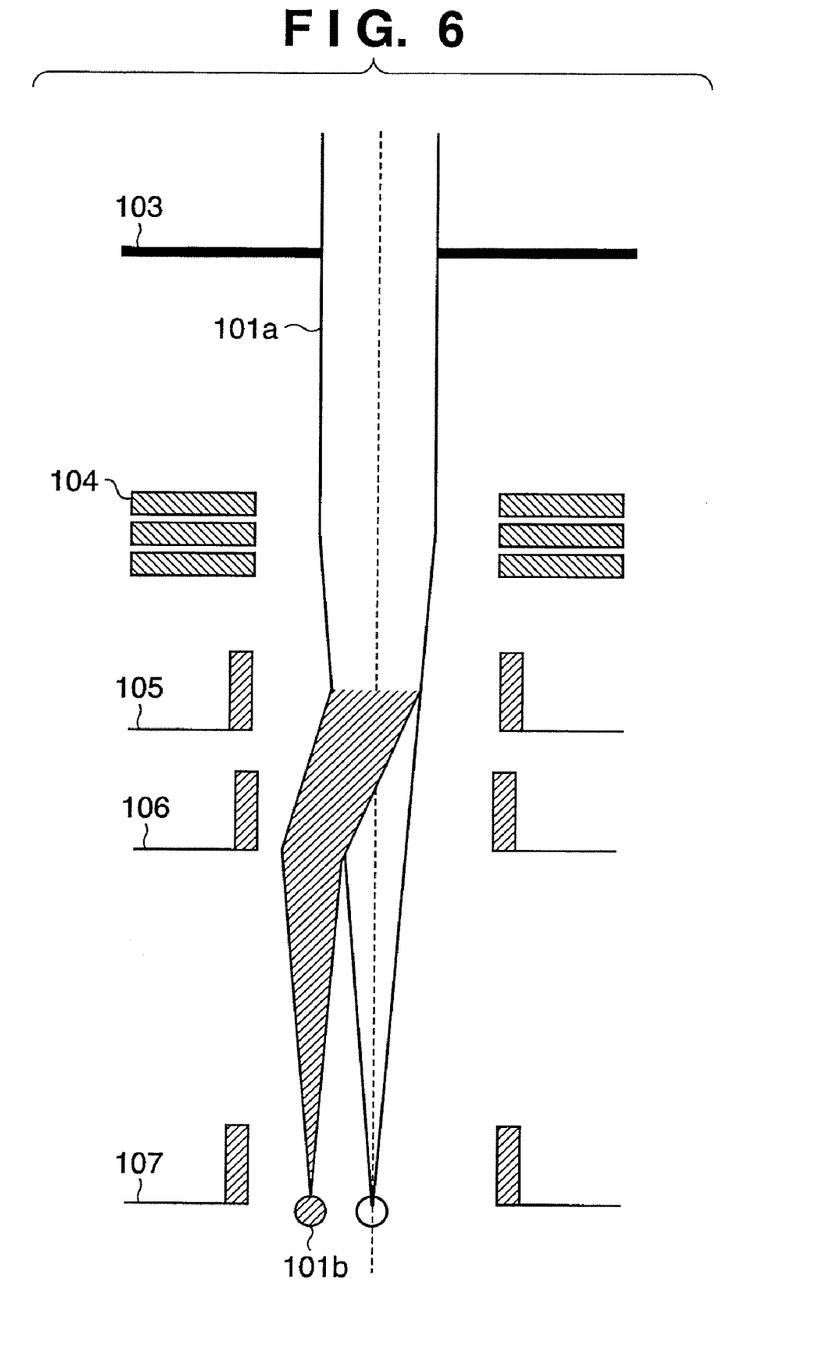
FIG. 6 is a view for explaining the function of a multi-source module of the electron beam exposure apparatus according to the preferred embodiment of the present invention.

The functions of units of the exposure apparatus will be explained with reference to FIG. 6. The aperture array 103 divides a collimated electron beam from the condenser lens 102 into a plurality of electron beams.

Each divided electron beam forms an intermediate image of the electron source (charged particle source) on a corresponding blanker of the blanker array 107 via a corresponding electro-static lens of the lens array 104. At this time, the deflector arrays 105 and 106 individually adjust the positions (positions within a plane perpendicular to the optical axis) of the intermediate images of the electron source formed on the blanker array 107.

An electron beam deflected by the blanker array 107 is shielded by a blanking aperture AP shown in FIG. 5 and, therefore, does not reach the wafer 4. On the other hand, an electron beam, which is not deflected by the blanker array 107, is not shielded by the blanking aperture AP shown in FIG. 5 and, therefore, reaches the wafer 4.

Referring back to FIG. 6, each of a plurality of intermediate images 101b of the electron source (charged particle source) formed by the multi-source module 1 is projected onto the wafer 4 via the two corresponding magnetic field lenses of the magnetic field lens arrays 21 and 22.

Of the optical characteristics, when the plurality of intermediate images are projected onto the wafer 4, the image rotation and magnification can be adjusted by the deflector arrays 105 and 106 capable of adjusting the position of each intermediate image on the blanker array 107. The focal position can be adjusted by dynamic focus lenses (electro-static or magnetic field lenses) 108 and 109 arranged for each column.

Figure 7:
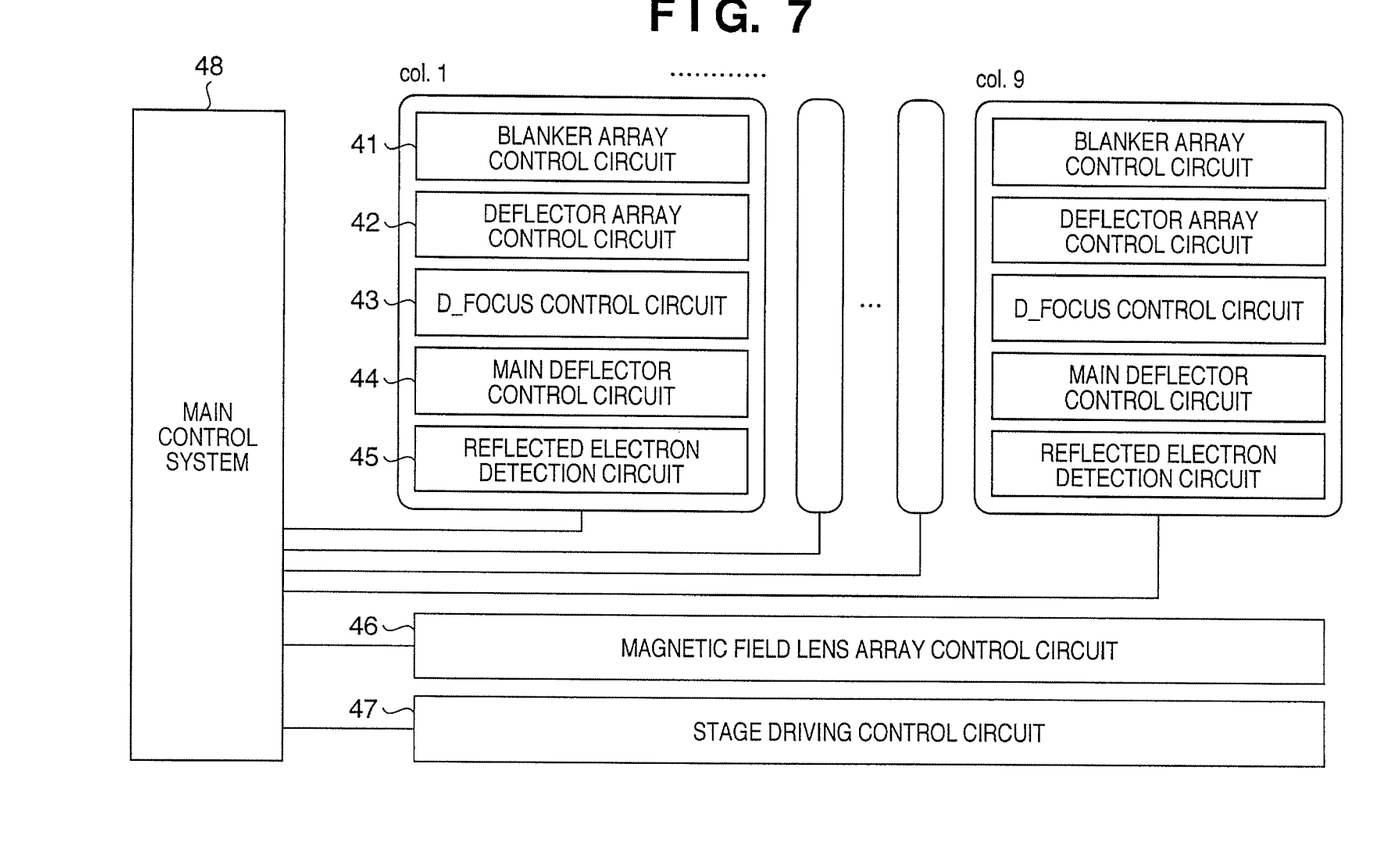
FIG. 7 is a block diagram for explaining a system configuration of the electron beam exposure apparatus according to the preferred embodiment of the present invention shown in FIGS. 4A and 4B.

A system configuration of the exposure apparatus will be explained with reference to the system configuration shown in FIG. 7. A blanker array control circuit 41 individually controls the plurality of blankers of the blanker array 107. A deflector array control circuit 42 individually controls the deflectors of the deflection arrays 104 and 105.

A D_FOCUS control circuit 43 individually controls the dynamic focus lenses 108 and 109. A main deflector control circuit 44 controls the main deflector 3. A reflected electron detection circuit 45 processes a signal from the reflected electron detector 7. The blanker array control circuit 41, deflector array control unit 42, D_FOCUS control circuit 43, main deflector control circuit 44, and reflected electron detection circuit 45 are prepared for each of the columns, column 1 to column 9.

A magnetic field lens array control circuit 46 controls the common coils of the magnetic field lens arrays 21, 22, 23, and 24. A stage driving control circuit 47 controls the driving of the stage 5 in cooperation with a laser interferometer (not shown) for detecting its position. A main control system 48 controls the above-described plurality of control circuits to manage the overall electron beam exposure apparatus.

An embodiment of a device manufacturing method using the above-described exposure apparatus will be explained with reference to FIGS. 8 and 9.

Figure 8:
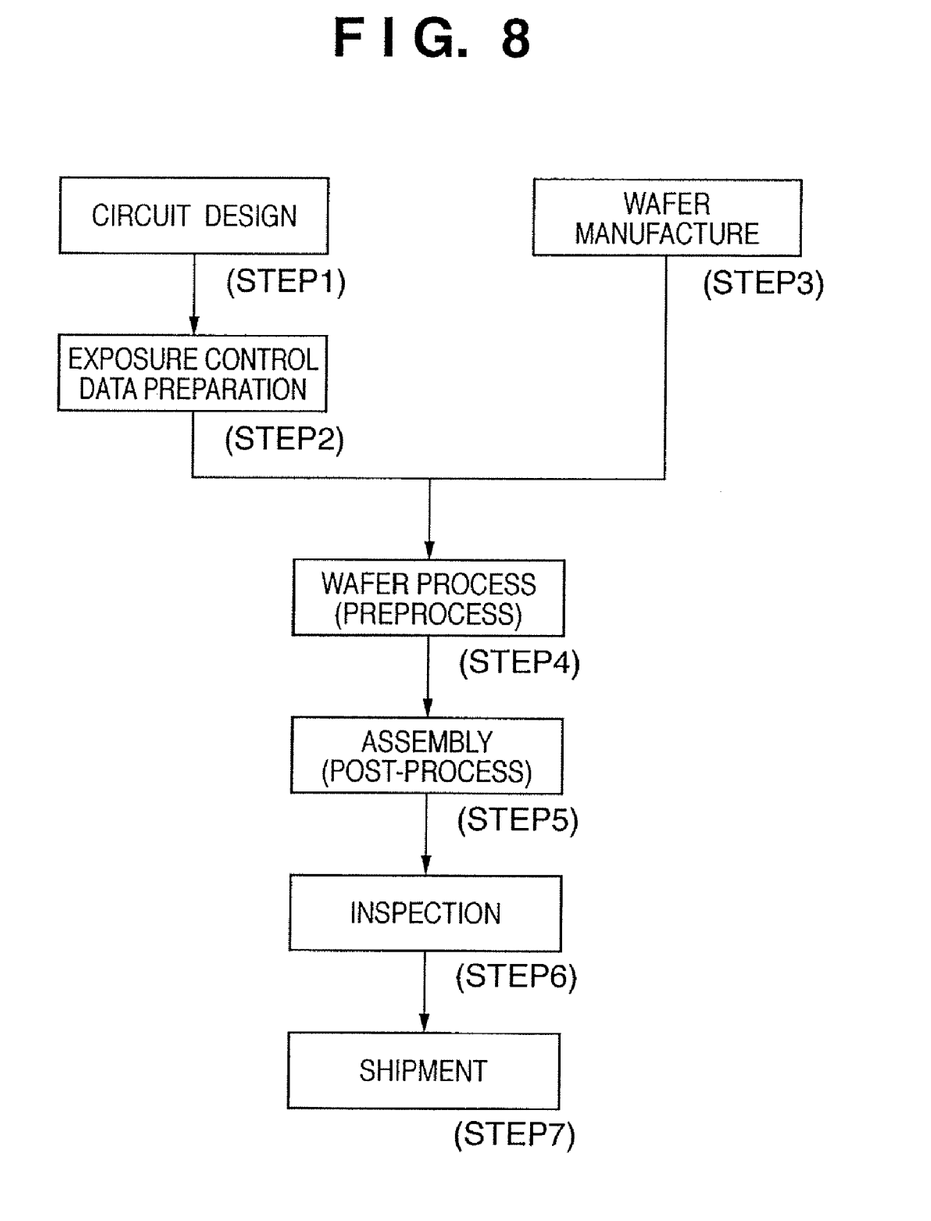
FIG. 8 is a flowchart for explaining the device manufacture using an exposure apparatus according to the present invention.

FIG. 8 is a flowchart for explaining the manufacture of a device (e.g., a semiconductor chip, such as an IC or LSI, an LCD, or a CCD). A semiconductor chip manufacturing method will be exemplified here. In step 1 (circuit design), the circuit of a semiconductor device is designed. In step 2 (exposure control data preparation), exposure control data is prepared on the basis of the designed circuit pattern. In step 3 (wafer manufacture), a wafer is manufactured using a material such as silicon. In step 4 (wafer process), called a pre-process, circuit patterns are formed on the wafer by using the above-described exposure apparatus. The exposure apparatus is controlled by the exposure control data. In step 5 (assembly), called a post-process, a semiconductor chip is formed using the wafer manufactured in step 4. This step includes an assembly step (dicing and bonding) and a packaging step (chip encapsulation).

In step 6 (inspection), the semiconductor device manufactured in step 5 undergoes inspections, such as an operation confirmation test and a durability test. After these steps, the semiconductor device is completed and shipped, in step 7.

Figure 9:
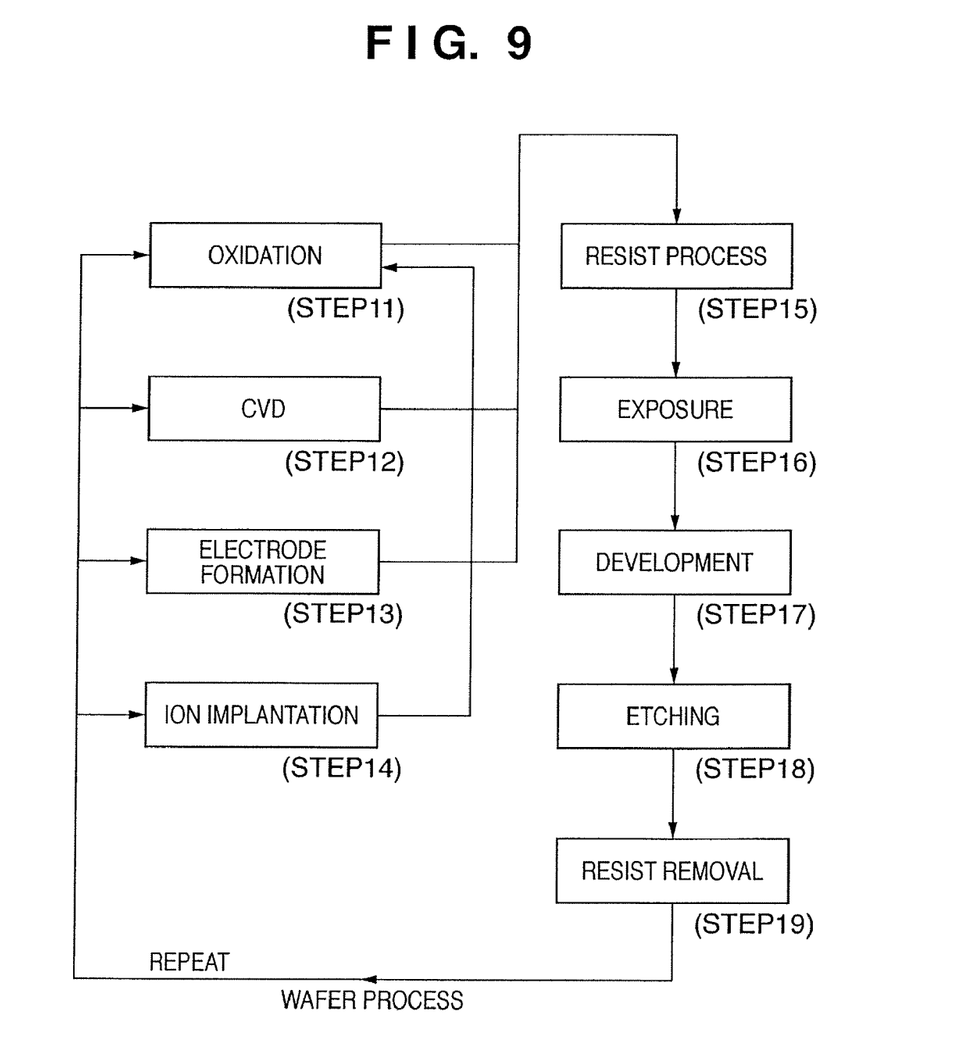
FIG. 9 is a flowchart illustrating details of the wafer process in step 4 of the flowchart shown in FIG. 8.

FIG. 9 is a flowchart showing details of the wafer process in step 4. In step 11 (oxidation), the wafer surface is oxidized. In step 12 (CVD), an insulating film is formed on the wafer surface. In step 13 (electrode formation), an electrode is formed on the wafer by vapor deposition.

In step 14 (ion implantation), ions are implanted in the wafer. In step 15 (resist process), a photosensitive agent is applied to the wafer. In step 16 (exposure), the exposure apparatus draws the circuit pattern on the wafer in accordance with the exposure control data. In step 17 (development), the exposed wafer is developed. In step 18 (etching), portions other than the developed resist image are etched. In step 19 (resist removal), any unnecessary resist remaining after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A deflector array comprising:
    a plurality of deflectors, which deflect charged particle beams, arrayed on a substrate,
    wherein each of said plurality of deflectors includes a single opening formed in the substrate, and each of said plurality of deflectors including a pair of electrodes that oppose each other through the opening and being configured to deflect a single charged particle beam, and
    wherein said plurality of deflectors are arrayed such that a length of said pair of electrodes in a longitudinal direction thereof is not less than a distance between centers of two of said plurality of deflectors that are located nearest to each other, said plurality of deflectors being arrayed to form a rectangular lattice, the longitudinal direction being tilted with respect to a direction of a side of a rectangle in the rectangular lattice.

2. The deflector array according to claim 1, wherein a direction of a line connecting the centers forms an angle of 45° with respect to a direction in which each of said plurality of deflectors deflects the charged particle beam.

3. The deflector array according to claim 1, wherein a direction of a line connecting the centers forms an angle of 63.4° with respect to a direction in which each of the plurality of deflectors deflects the charged particle beam.

4. The deflector array according to claim 1, wherein a direction in which each of the plurality of deflectors deflects the charged particle beam is perpendicular to the longitudinal direction of said pair of electrodes.

5. The deflector array according to claim 1, wherein said pair of electrodes are parallel to each other.

6. The deflector array according to claim 1, wherein said pair of electrodes are formed such that a distance between said pair of electrodes shortens from centers toward end portions of said pair of electrodes.

7. An exposure apparatus which exposes a wafer with a charged particle beam, the apparatus comprising:
   a charged particle source which emits the charged particle beam;
   a first electron optical system which forms a plurality of intermediate images of said charged particle source;
   a second electron optical system which projects the plurality of intermediate images formed by said first electron optical system onto the wafer; and
   a positioning apparatus which holds and positions the wafer,
   wherein said first electron optical system includes a deflector array defined in claim 1.

8. A method of manufacturing a device, the method comprising:
   exposing a wafer with a charged particle beam using an exposure apparatus defined in claim 7;
   developing the exposed wafer; and
   processing the developed wafer to manufacture the device.

9. The deflector array according to claim 1, wherein the deflector array includes deflectors with three rows and three columns.

* * * * *